United States Patent
Guo

(10) Patent No.: US 7,588,669 B2
(45) Date of Patent: Sep. 15, 2009

(54) SINGLE-PROCESS-CHAMBER DEPOSITION SYSTEM

(75) Inventor: George Xinsheng Guo, Palo Alto, CA (US)

(73) Assignee: Ascentool, Inc., Cupertino, CA (US)

( * ) Notice: Subject to any disclaimer, the term of this patent is extended or adjusted under 35 U.S.C. 154(b) by 762 days.

(21) Appl. No.: 11/185,241

(22) Filed: Jul. 20, 2005

(65) Prior Publication Data

US 2007/0017799 A1    Jan. 25, 2007

(51) Int. Cl.
*C23C 14/35* (2006.01)
(52) U.S. Cl. .............. 204/298.2; 204/298.12; 204/298.08; 204/298.23; 204/298.26
(58) Field of Classification Search .............. None
See application file for complete search history.

(56) References Cited

U.S. PATENT DOCUMENTS

| | | | |
|---|---|---|---|
| 4,505,798 A | | 3/1985 | Ramachandran |
| 4,521,287 A | * | 6/1985 | Kisner ............. 204/192.15 |
| 5,171,415 A | | 12/1992 | Miller |
| 5,333,726 A | | 8/1994 | Makowiecki |
| 5,747,119 A | | 5/1998 | Hirata |
| 5,755,938 A | | 5/1998 | Fukui |
| 5,953,827 A | | 9/1999 | Or |
| 5,985,115 A | | 11/1999 | Hartsough |
| 6,080,287 A | | 6/2000 | Drewery |
| 6,113,752 A | | 9/2000 | Hollstein |
| 6,143,149 A | * | 11/2000 | Abe ................. 204/298.26 |
| 6,207,026 B1 | | 3/2001 | Crocker |
| 6,221,217 B1 | | 4/2001 | Moslehi |
| 6,235,634 B1 | | 5/2001 | White |
| 6,238,532 B1 | | 5/2001 | Rossnagel |
| 6,413,380 B1 | | 7/2002 | Pinarbasi |
| 6,454,920 B1 | | 9/2002 | Haag |
| 6,641,701 B1 | | 11/2003 | Tepman |
| 6,641,703 B2 | * | 11/2003 | Nomura et al. ........ 204/192.12 |
| 6,692,618 B2 | | 2/2004 | Dubs |
| 6,730,194 B2 | | 5/2004 | Schertler |
| 6,740,585 B2 | | 5/2004 | Yoon |
| 6,758,948 B2 | | 7/2004 | Johnson |
| 2002/0162737 A1 | * | 11/2002 | Durs ................. 204/192.12 |

FOREIGN PATENT DOCUMENTS

JP      2004269939 A    *    9/2004

OTHER PUBLICATIONS

English Machine Translation of JP 2004269939 A by Takahashi. Published Sep. 2004.*

* cited by examiner

*Primary Examiner*—Nam X Nguyen
*Assistant Examiner*—Jason M Berman
(74) *Attorney, Agent, or Firm*—Xin Wen

(57) ABSTRACT

A deposition system includes a process chamber, a workpiece holder for holding the workpiece within the process chamber, a first target comprising a first material, a second target comprising a second material, a single magnet assembly disposed that can scan across the first target and the second target to deposit the first material and the second material on the workpiece, and a transport mechanism that can cause relative movement between the magnet assembly and the first target or the second target.

20 Claims, 11 Drawing Sheets

SINGLE-PROCESS-CHAMBER DEPOSITION SYSTEM

TECHNICAL FIELD

This application relates to a deposition system for depositing materials on a substrate.

BACKGROUND

Physical Vapor Deposition (PVD) is a common process in micro-fabrication technologies. Referring to FIGS. 1A and 1B, a deposition system 100 includes a process chamber 110, a workpiece holder 120 that can hold a workpiece 130, a target 150, and a magnetron sputtering source 160. The target 150 can comprise a material to be sputtered by the magnetron-sputtering source 160 and deposited on the workpiece 130. The workpiece holder 120 and the workpiece 130 are typically stationary in the process chamber 110 during the deposition. The magnetron source is disposed in the vicinity of each target. The target is supported by a backing plate comprising inside a cooling system that can be a cooling water channels within the backing plate or a cooling liquid bath in which the the entire magnetron 160 and target 150 are immersed. During deposition, the magnetron-sputtering source 160 stays stationary or moves relative to the target 150. Only one material is deposited at a time in this configuration. The magnetron typically covers the entire target during deposition to maximize the usage of the target.

The workpiece can be a silicon wafer. The target material can include Au, Cu, Ta, Al, Ti, TiW, Ni, NiV etc. In a sputtering operation, a target comprising a desired sputtering material is first mounted in the process chamber 110. The process chamber 110 is pumped down to a reduced pressure. A layer of the sputtering material in the target is deposited on the workpiece 130 to form a deposition layer over the workpiece.

The micro-fabrication devices often require multilayer structures such as TiW/Au, Ti/TiN/Al, TaN/Ta/Cu to be deposited on the substrate of a silicon wafer without exposing to air between different layers. Even if air exposure is allowed between various film layers, the multi-layer deposition can be quite time consuming using the deposition system 100. The deposition of each layer requires a sequence of steps including the mounting of a target comprising the material for that layer, vacuum pump down, pressure adjustment and pressure stability, sputtering deposition to form the layer on the substrate of the workpiece 130, followed by the pressure increase and the target switching for the next deposition layer. A cleaning step may be added to avoid contamination between successive deposition layers. The same cycle is repeated for each of the deposition layers. In summary, the deposition of a multi-layer structure of the deposition system 100 requires a number of vacuum pump downs, pressure adjustment, target handling and mounting, and cleaning steps. The low system throughput limits the applications of the deposition system 100.

In another deposition system 200 as shown in FIGS. 2A and 2B, multiple pairs of targets 250 and 251 and magnetron sputtering sources 260 and 261 are enclosed in a single process chamber 210. Each of the magnetron sources 260 and 261 is disposed in the vicinity of its associated target 250 or 251. Each of the targets 250 and 251 is supported by a backing plate that can be cooled by a cooling system that can include channels within the backing plate for flowing a cooling fluid or a cooling liquid bath in which the targets 250 and 251 and the magnetron sputtering sources 260 and 261 can be immersed. During the deposition, workpieces 230 and 231 can be moved by a workpiece holder 220 to deposition areas and to receive the deposition of materials sputtered off targets 250, 251 without breaking the vacuum. The workpiece holder 220 and the workpieces 230 and 231 typically rotate around the center of the workpiece holder 220 in the process chamber 210. The magnetron sputtering source 260 and 261 can stay stationary or move relative to the targets 250 and 251 during deposition. Multiple materials can be deposited by moving the workpieces 260 and 261 under the different targets 250 and 251.

The deposition system 200 has a large footprint due to the housing of multiple workpieces and associated higher cost of manufacturing. The costs of target materials are also high because the targets need to be large enough to match the size of the workpieces. The disadvantages in cost and size limit the application of the deposition system 200.

SUMMARY

Implementations of the system may include one or more of the following. In one aspect, the present invention relates to a deposition system, comprising:

a process chamber;

a workpiece holder within the process chamber, configured to hold a workpiece;

a first target comprising a first material, disposed within the process chamber;

a second target comprising a second material, disposed within the process chamber;

a single magnet assembly disposed in the vicinity of the first target and the second target, configured to scan across the first target and the second target to deposit the first material and the second material on the workpiece; and a transport mechanism operatively coupled to the magnet assembly, configured to cause relative movement between the magnet assembly and the first target or the second target.

In another aspect, the present invention relates to a method for physical vacuum deposition in a process chamber, comprising:

producing a relative scanning movement between a magnet and a first target comprising a first material;

sputtering the first material off the first target;

depositing the first material on a workpiece to form a first layer over the workpiece;

producing a relative scanning movement between the magnet and a second target comprising a second material;

sputtering the second material off the second target; and depositing the second material on the first layer to form a second layer over the first layer on the workpiece, wherein the second target is not cleaned after the formation of the first layer and before the deposition of the second material on the first layer.

In yet another aspect, the present invention relates to a method for physical vacuum deposition in a process chamber, comprising:

producing a relative scanning movement between a magnet and a first target comprising a first material;

sputtering the first material off the first target;

depositing the first material on a workpiece to form a first layer over the workpiece;

producing a relative scanning movement between the magnet and a second target comprising a second material;

sputtering the second material off the second target;

depositing the second material on the first layer to form a second layer over the first layer, wherein the second target is not cleaned after the formation of the first layer and before the deposition of the second material on the first layer;

producing a relative scanning movement between the magnet and a third target to sputter the third material off the third target;

cleaning at least the third target after the formation of the second layer and before the sputtering of the third material off the third target, wherein the first material, the second material, and the third material are three different materials; and depositing the third material on the second layer to form a third layer over the second layer on the workpiece.

Embodiments may include one or more of the following advantages. The disclosed deposition system includes a sputter source comprising a plurality of sputtering materials. A magnetron system can scan each of the sputtering materials in the sputtering source such that different materials can be deposited to form a multi-layer structure without breaking vacuum, and the associated vacuum pump-downs and pressure adjustments between the depositions of successive layers. As a result, the throughput and usage efficiency of the deposition system are significantly increased without requiring a multi-chamber deposition system.

Another advantage of the disclosed deposition system is that it is flexible, compact and low-cost. The disclosed deposition system includes a single process chamber that can provide multi-layer depositions. The disclosed deposition system provides more capabilities than the prior art single chamber deposition system, and smaller foot print and lower-cost than prior art multi-chamber deposition systems.

Yet another advantage of the disclosed deposition system is that it reduces contamination in the vacuum depositions. The workpieces can stay in the vacuum throughout the depositions of multiple layers without exposing to the ambient environment and possibility of contamination during the target switching.

The details of one or more embodiments are set forth in the accompanying drawing and in the description below. Other features, objects, and advantages of the invention will become apparent from the description and drawings, and from the claims.

BRIEF DESCRIPTION OF THD DRAWINGS

DETAILED DESCRIPTION

Figure 1A:
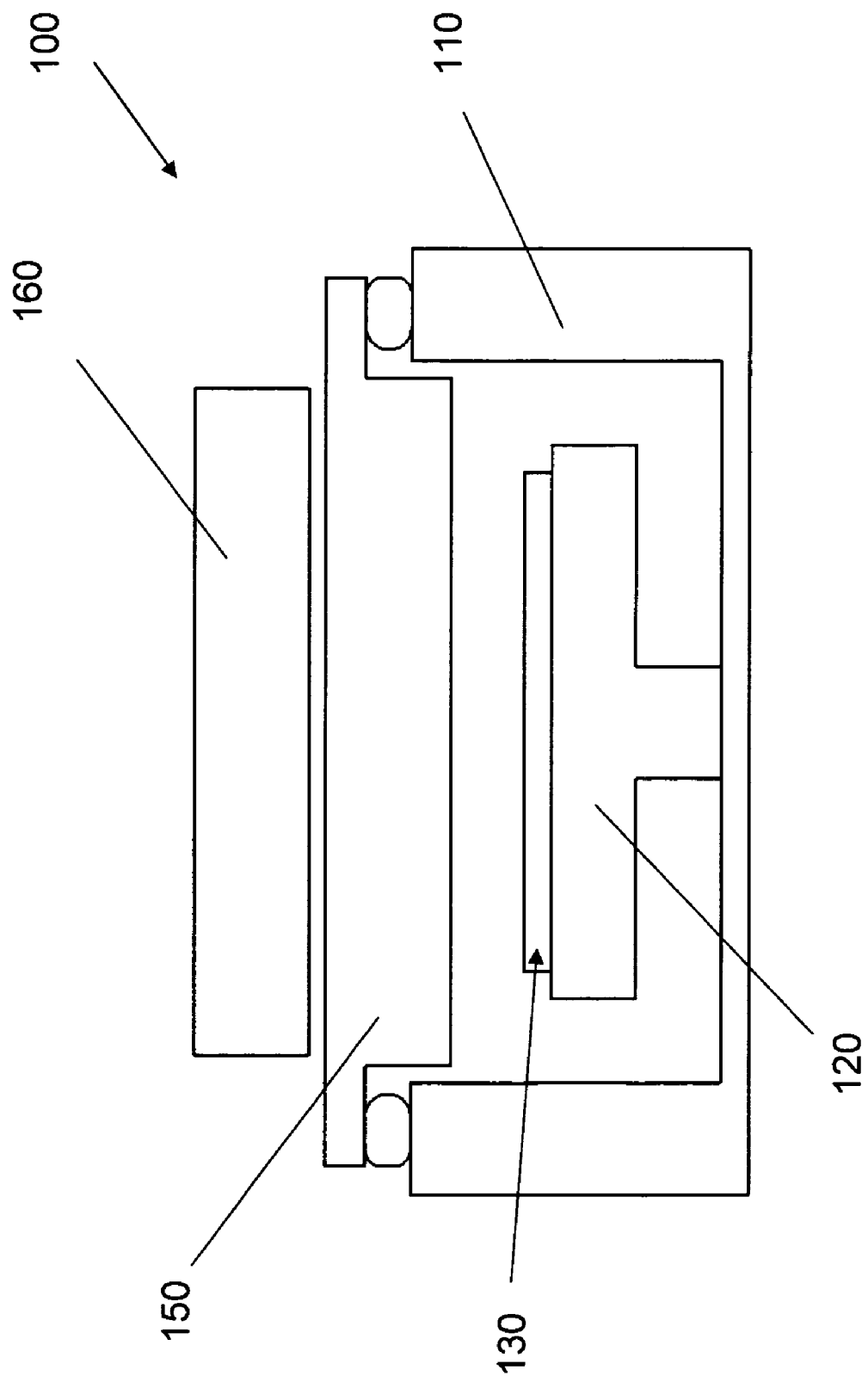
FIG. 1A is a cross-sectional view of a prior-art deposition system.
Figure 1B:
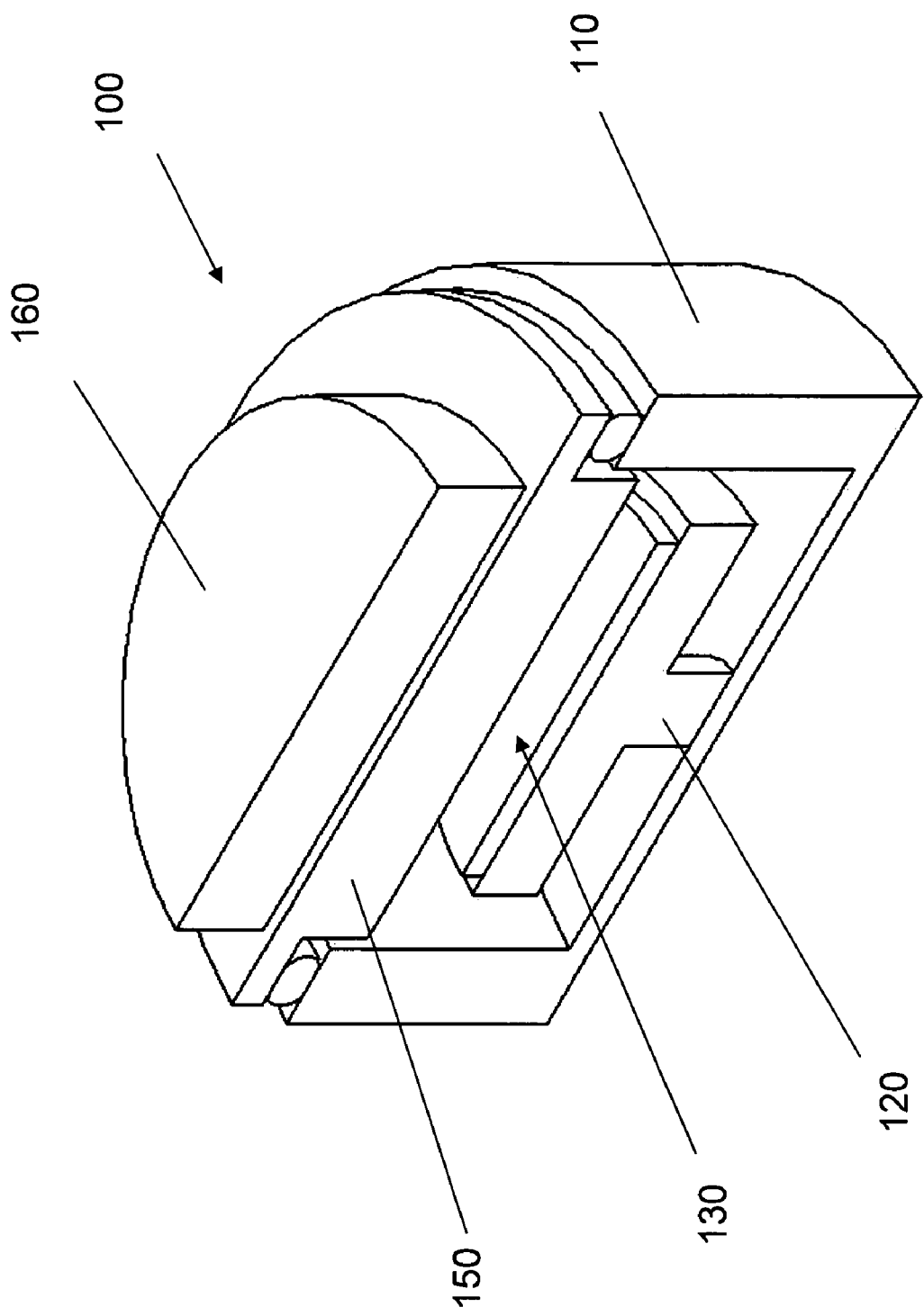
FIG. 1B is a perspective view of the prior-art deposition system in FIG. 1A.
Figure 2A:
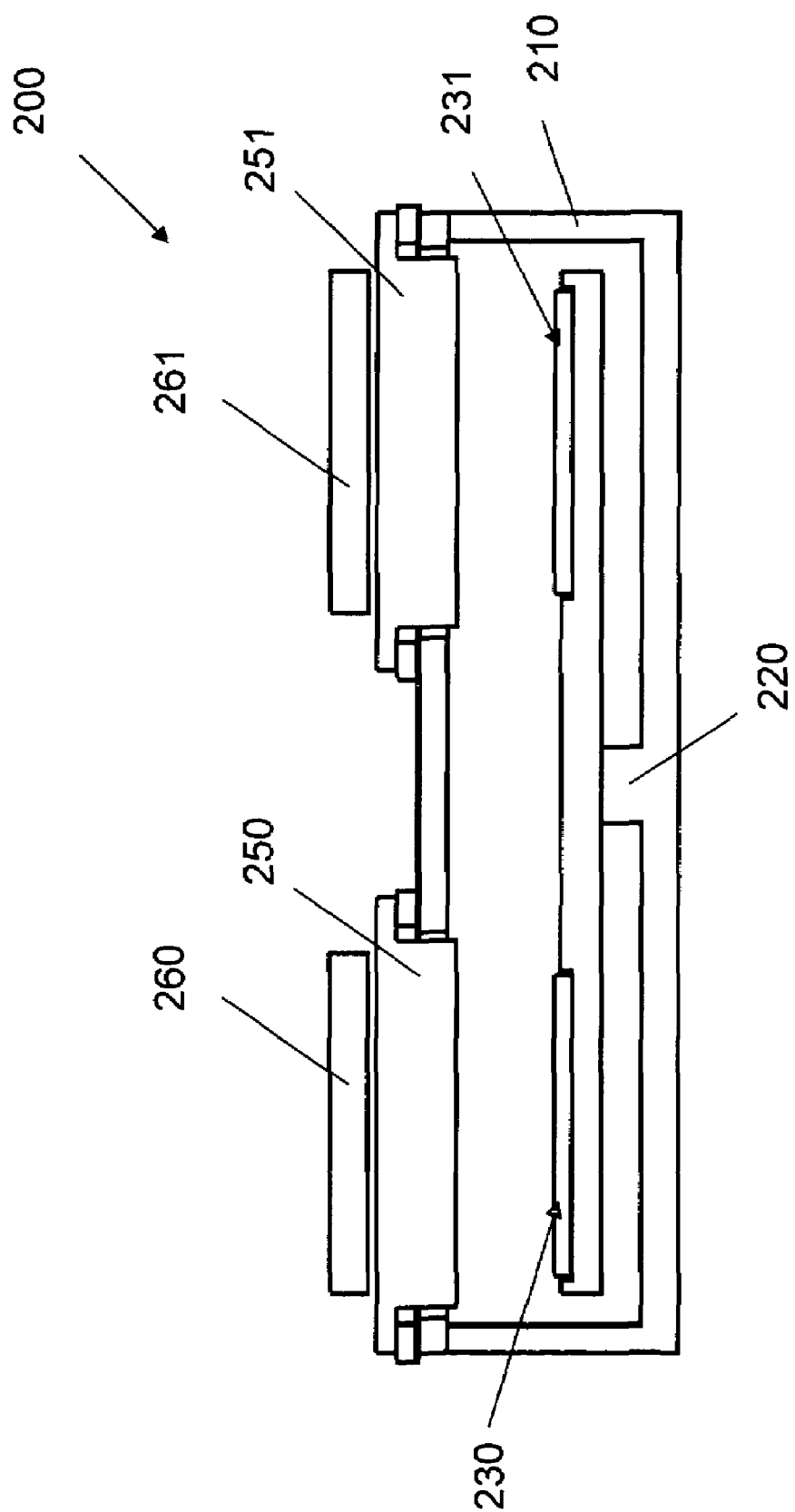
FIG. 2A is a cross-sectional view of another prior-art deposition system.
Figure 2B:
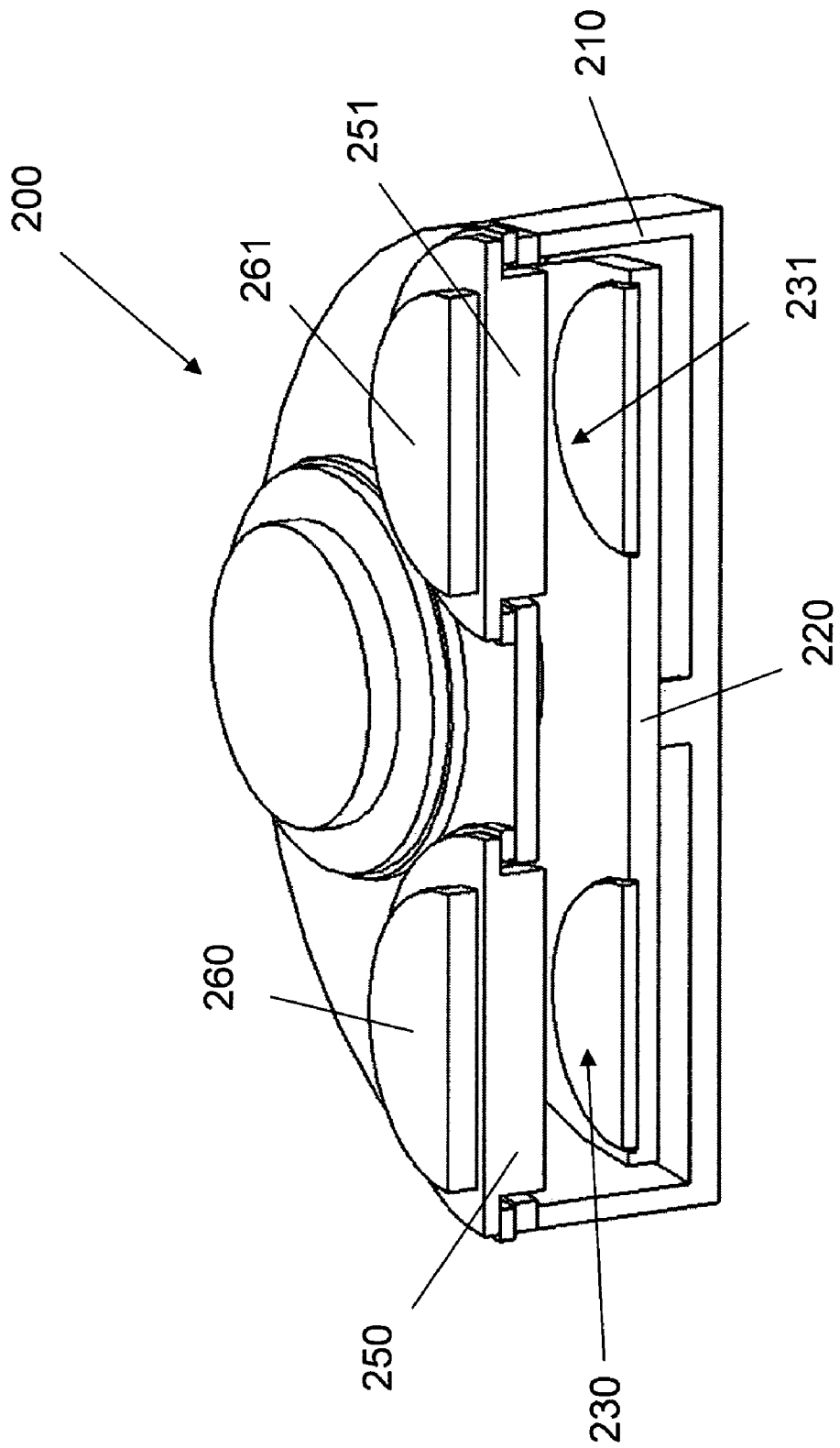
FIG. 2B is a perspective view of the prior-art deposition system in FIG. 2A.
Figure 3:
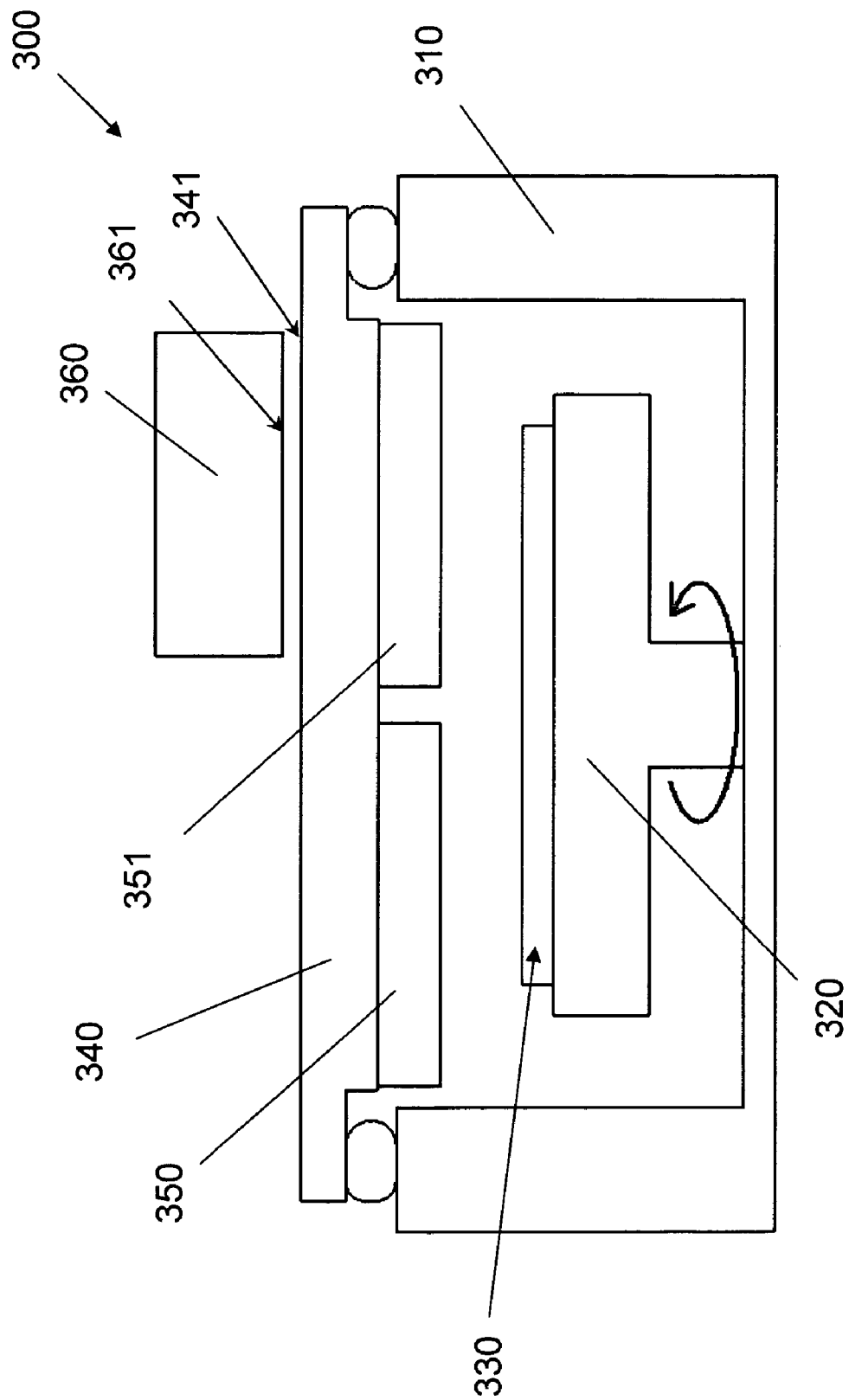
FIG. 3 is a cross-sectional view of a single-chamber deposition system in accordance with the present invention.
Figure 4:
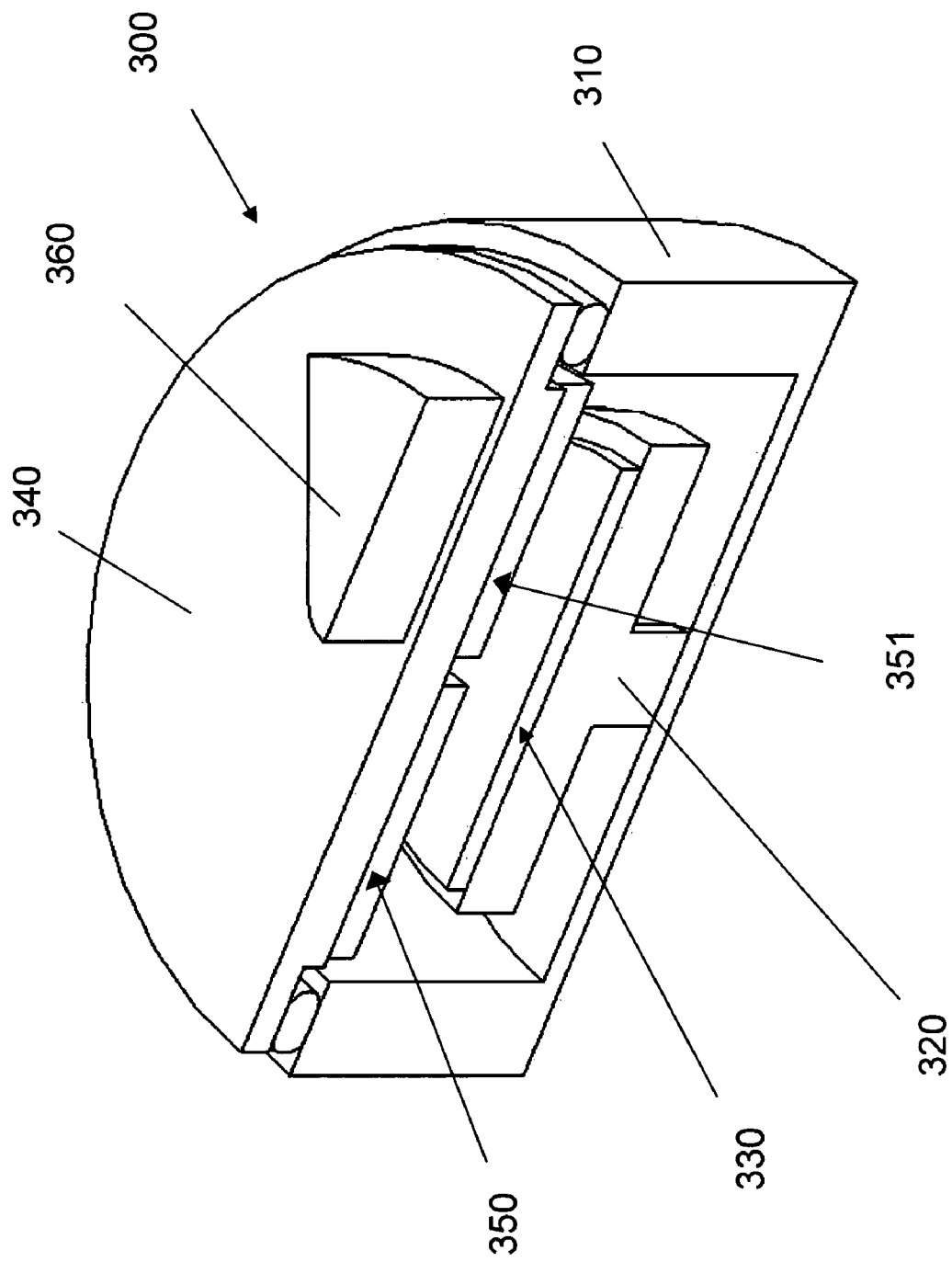
FIG. 4 is a perspective view of the single-chamber deposition system of FIG. 3.

This invention addresses the above disadvantages of the prior-art system by providing a compact single-chamber deposition system that is capable of depositing multi-layer structures on a substrate while eliminating or reducing the number of vacuum evacuations. As shown in FIGS. 3 and 4, a deposition system 300 includes a single process chamber 310, a workpiece holder 320 that can hold a workpiece 330, a backing plate 340, a plurality of targets 350 and 351, and a magnet 360. The workpiece 330 can include a silicon wafer, glass substrate, optical disk, and etc. The deposition system 300 also includes a vacuum pump that can evacuate air from the process chamber to air pressure substantially below the atmospheric pressure. The deposition system 300 can include two, three, four, five, size or more targets, which is very flexible for multi-layer depositions comprising different materials.

In contrast to the prior art systems (e.g. deposition system 200) that include multiple magnetron sources each associated with a target, the deposition system 300 includes magnetron 360 that is shared by two or more targets 350 and 351. A rotation mechanism can move the magnet 360 from one target 350 to another target 351. One target can be sputtered one at a time during the deposition process. In general, the closed deposition system requires that a smaller number of (preferably one) magnetrons than the number of targets.

The targets 350, 351 comprise materials to be sputtered by the magnet 360 and deposited on the workpiece 330. The deposition system 300 can include two, three, or more targets each containing the same or different target materials. Typical sputtering materials can include Cu, Ta, Ti, Au, Ag, Al, Sn, Cr, W, Hf, Zr, Ni, etc. The sputtering material can also include compound or alloy materials such as TiW, TiNx, AlNx, AlOx, HfOx, TiOx, TaNx, NiV, ITO, and other solid materials. The targets 350, 351 are typically formed in plate shapes comprising a front surface from which the material is sputtered off and a back surface. The front surface of the targets 350, 351 can be substantially flat, shaped (especially after a period of sputtering), or even tilted.

The magnet 360 can be disposed adjacent to the back surface of one of the targets 350 or 351 across the backing plate 340. The magnet 360 is housed in a magnetic assembly that is commonly referred as magnetron. The magnet 360 is coupled to a magnetron rotation mechanism that can rotate the magnet 360 over each of the plurality of targets 350 and 351. The magnetic assembly includes a surface 361 that is adjacent and substantially parallel to the back surface 341 of the backing plate 340. The surface 361 can be substantially flat. The targets 350, 351 can be formed in a plate shape that is substantially parallel to the surface 361. The width of the surface 361 in the magnetic assembly 360 is narrower than the corresponding dimension of the targets 350 and 351 (e.g. along the azimuthal direction as shown in FIG. 4) such that the magnetic assembly 360 can scan across the areas of the targets 350 and 351. The scanning motion can be in the form of oscillations, periodic sweeping, periodic translations, periodic rotations, and other types of periodic movements. The magnetron rotation mechanism can scan across the back surface of each of the targets 350 and 351 along the radial direction, the azimuthal direction, or any other directions or pre-designed two-dimensional paths. The scanning motions and paths are designed to allow the target materials evenly sputtered off the targets 350 and 351 and thus increase the lifetimes of the targets, as well as to minimize cross-contamination between targets.

The scanning motions and paths of the magnet 360 are designed to ensure even deposition of the target materials over the substrate on the workpiece 330. In an embodiment, the scanning motion and movement paths of the magnet 360 can be programmed relative to the rotation of the workpiece 330 to optimize the material sputtering rate uniformity on substrate from the target and the deposition distribution over the workpiece 330. For example, the scanning speeds can depend on the direction of the magnet movement relative to the angular velocity of the workpiece rotation. For instance, they can be along the same or the opposite directions, offset or perpendicular to each, etc. The frequency of the scanning motion of the magnet 360 can be selected to be commensurate or incommensurate relative to the rotation frequency of the workpiece to minimize periodic undulations in the deposition rate or thickness over the workpiece substrate. For the same reasons, the phases of the periodic movements of the magnet 360's scanning motion can also be adjusted relative to the phase of the workpiece rotation. The scanning motion of the magnet 360 can also include a velocity component along the radial direction of the single process chamber 310.

The workpiece can be a disk-shaped silicon wafer that may have a diameter 150 mm, 200 mm, 300 mm, 450 mm, etc. The workpiece can also be made of other semiconductor materials such as Ge, GaAs, and a metal, a glass or a ceramic substrate. The deposition system 300 can be applied to semiconductor integrated circuits, flat panel displays, micro-fluidic devices, MEMS components, medical devices and electro-optical devices.

The workpiece holder 320 can be mounted on a rotation table coupled to a workpiece rotation drive mechanism around an axis that is substantially perpendicular and through the center of the target backing plate, which differs from some prior art systems (e.g. deposition system 200) that include a plurality of workpieces that can be rotated around an axis that is not through the center or outside of the workpieces. The workpiece holder 320 can include a plurality of push-up pins for receiving the workpiece 330. The workpiece holder 320 and the workpiece 330 can be rotated around its central axis by the workpiece rotation drive mechanism during the deposition process. Different areas of the wafer substrate can be exposed to the sputtered materials under the target being sputtered by the magnet 360 and to allow the sputtered material uniformly deposited over the substrate of the workpiece 330. The deposition system 300 can include a heating mechanism that can heat the workpiece 330 above the ambient temperature.

The targets 350 and 351 can be in plate shaped and made of sputtering materials. The target 350 or 351 is bonded to a backing plate by thermal conductive bonding, or can attached to the backing plate with fasteners. The backing plate includes a cooling system that may be a network of water channels for running a cooling fluid during sputtering, or the target can be immersed in cooling solutions. The backing plate and the target are negatively biased relative to certain parts of the process chamber 310 (e.g. the chamber wall). The deposition system 300 includes a necessary electric circuitry to provide the power for the negative electric potential at the target.

Before sputtering, the process chamber 310 can also be filled with a gas to cause the pressure within the process chamber to be in the range of 0.01 milli-Torr to 1000 milli-Torr. Desirable gases can include Argon, Nitrogen, oxygen and Hydrogen. The positive ions generated by free electrons are accelerated by the biasing field to bombard one of the targets 350,351 and to sputter target materials off the target. The magnet 360 scans across the back surface of the target during the sputtering process to create a magnetic field near the front surface of the target. The magnetic field confines electrons near the sputtering side of the target surface and effectively increases the free path of the electrons. The confined electrons can collide with the gas atoms to produce positive ions that can bombard the target surfaces. The increased ion bombardment caused by the magnetic field decreases the operating pressure required for the sputtering and material deposition.

In present invention, the magnet 360 only has its magnetic flux over one target material (350 or 351) to minimize the sputtering from other targets during deposition. The disclosed system can include other arrangement to further reduce sputtering from multiple targets: physical barriers 640, 641, 642, 643 between targets can drastically dampen the tail of the magnetic field into the adjacent targets. Electrically isolating target allows specific negative electric biasing over only the desired sputtering target. The ion bombardment can thus be focused only on a single target. The unwanted sputtering can be essentially eliminated by covering the adjacent targets by one or more shutters prevent deposition from the adjacent targets. Specifically, a shutter can be a rotatable plate disposed under the targets 350, 351. The rotatable plate includes a window that allows only one target to be exposed for sputtering at a time.

Figure 5:
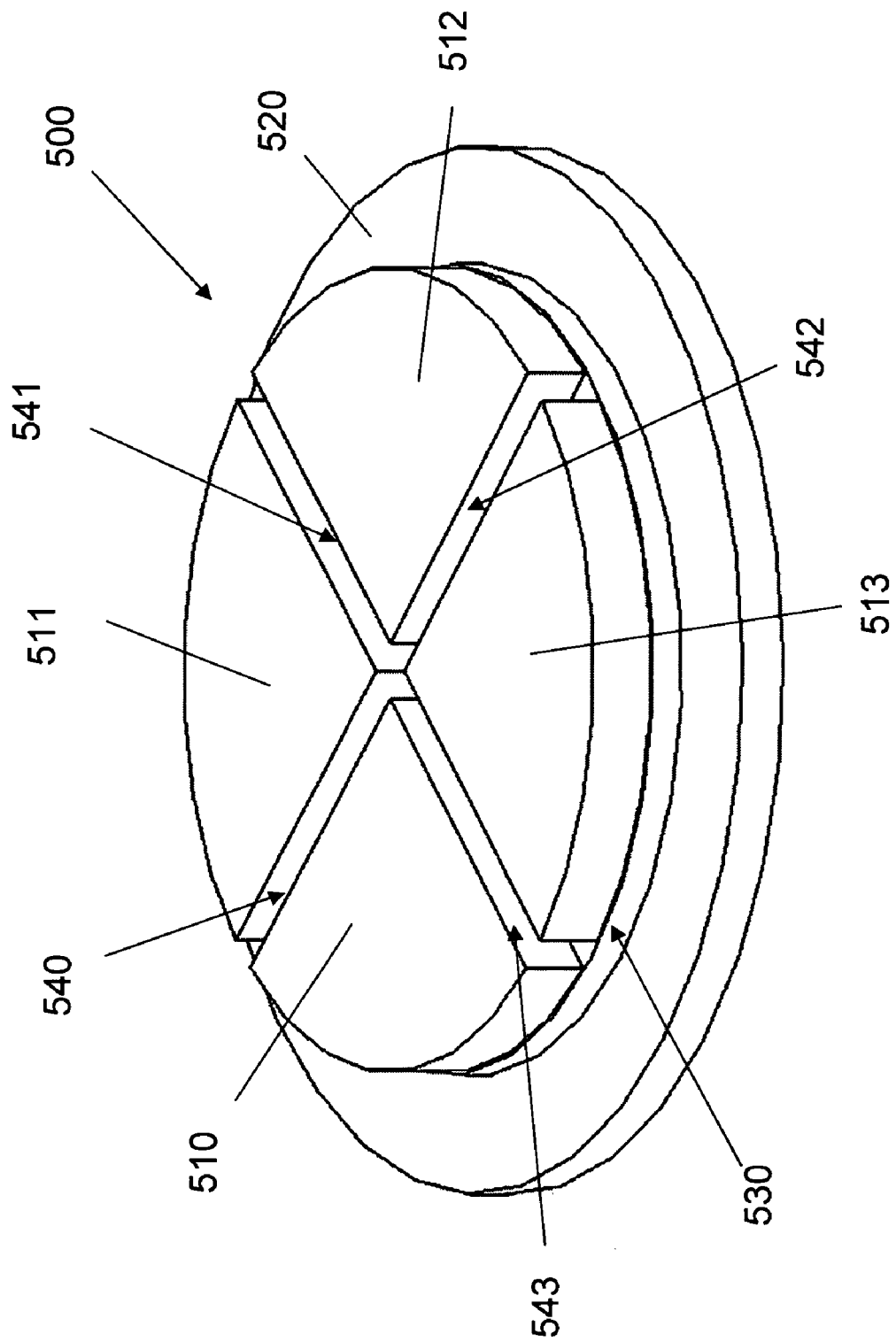
FIG. 5 shows the bottom view of a target system comprising a plurality of targets in accordance to an embodiment of the present invention.

The targets 350 and 351 can be electrically isolated from each other. Alternatively, the targets 350 and 351 can be electrically connected with each other. FIG. 5 shows the detailed bottom view of a target system 500 compatible with the deposition system 300 in accordance to an embodiment of the present invention. The target system 500 includes a plurality of targets 510-513 that may be made of different or the same sputtering materials. The targets 510-513 are bonded to a backing plate 520 by a thermal conductive bonding layer 530, fasteners, or other ways of mechanically attachment. The targets 510-513 are separated by gaps 540-543 to electrically isolate adjacent targets as well as to reduce contamination between targets that contain different sputtering materials.

Figure 6:
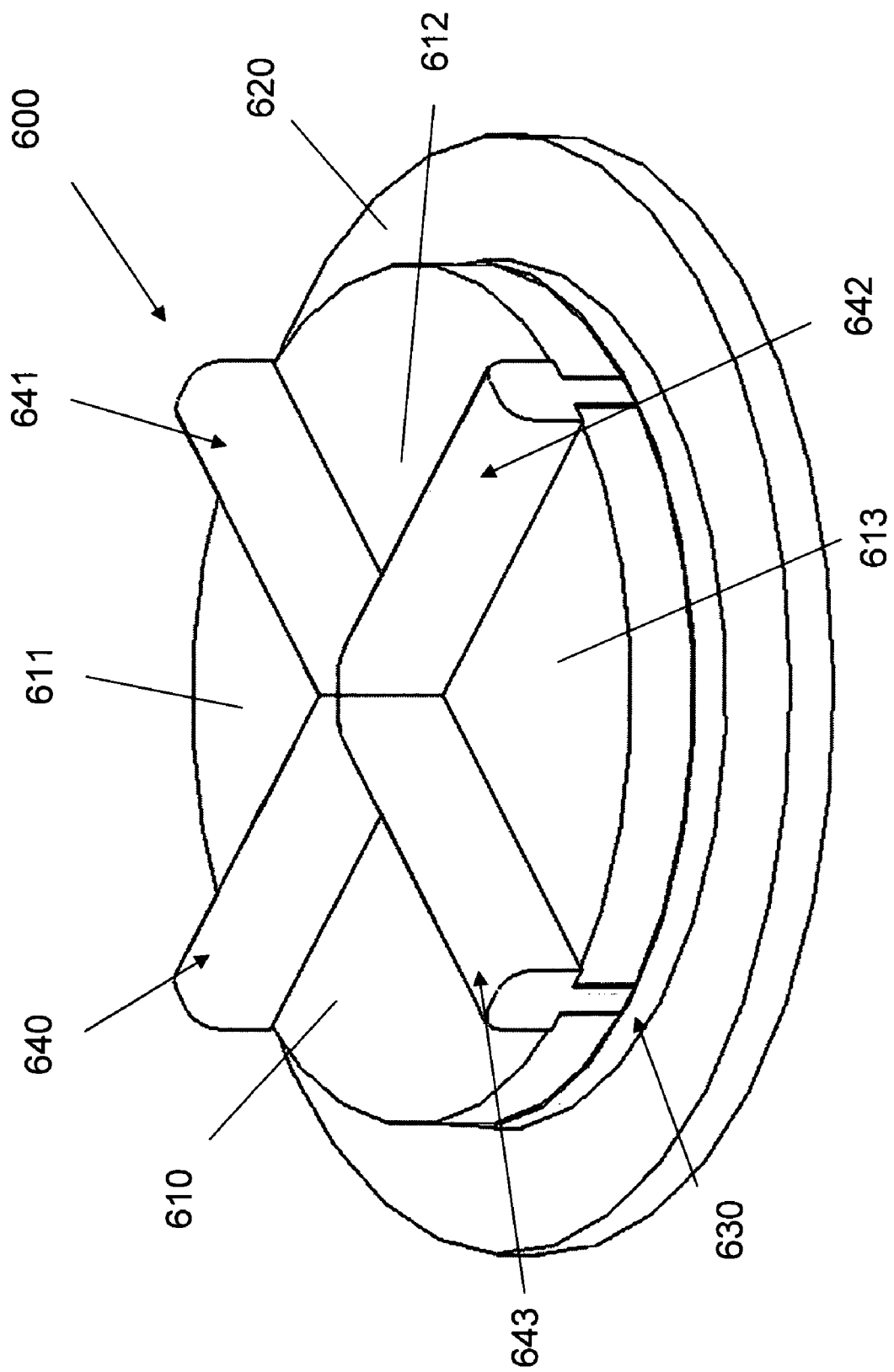
FIG. 6 shows the bottom view of a target system comprising a plurality of targets in accordance to another embodiment of the present invention.
Figure 7:
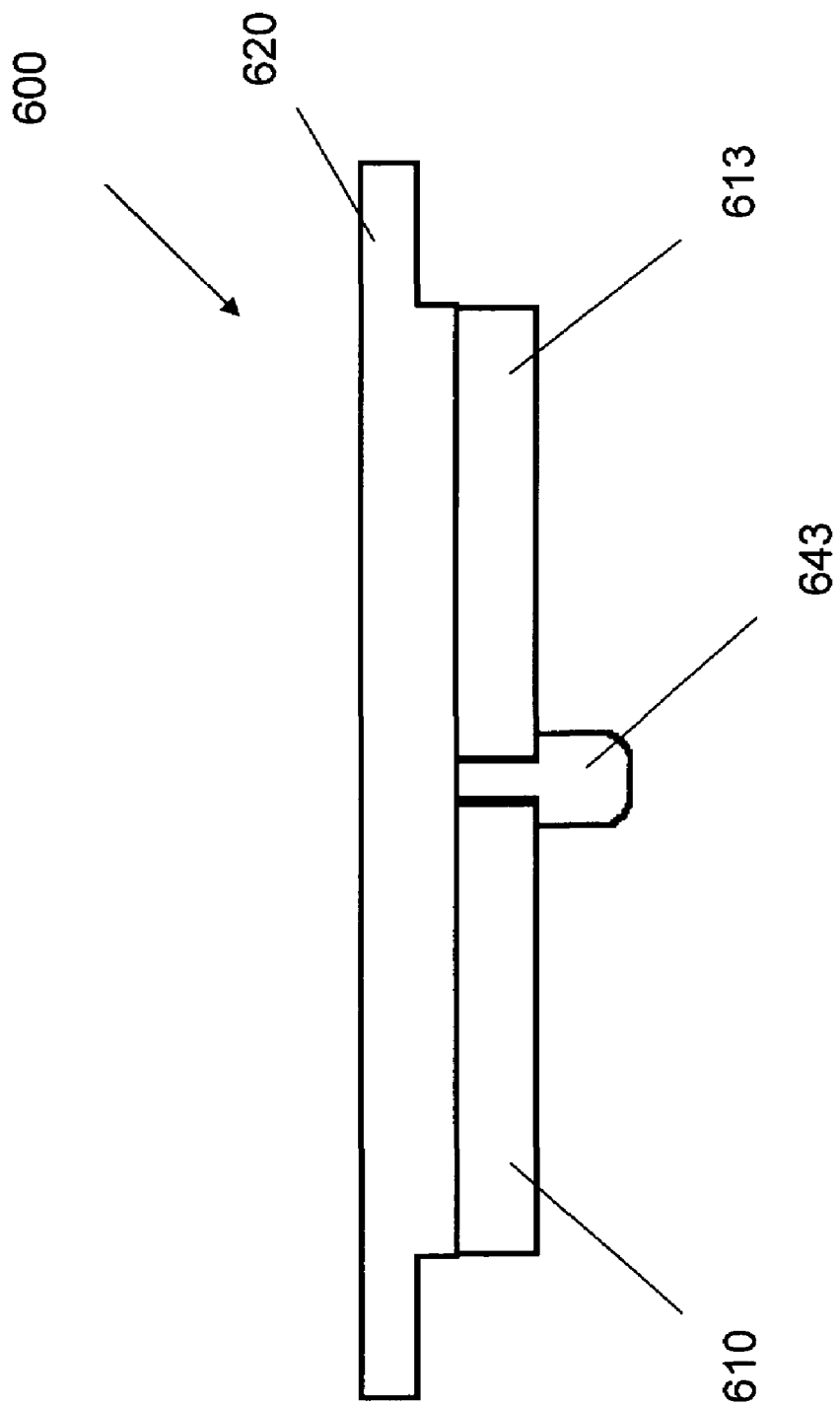
FIG. 7 illustrates the cross sectional view of the target system of FIG. 6.

FIG. 6 shows the bottom view of a target system 600 compatible with the deposition system 300 in accordance to another embodiment of the present invention. The target system 600 includes a plurality of targets 610-613 made of different or the same sputtering materials. The targets 610-613 are bonded to a backing plate 620 by a thermal conductive bonding layer 630. Targets 610-613 are separated by barriers 640-643 that can isolate adjacent targets as well as reduce contamination between targets of different sputtering materials. FIG. 7 shows a cross sectional view of the target system 600. Targets 610, 613 are bonded to the backing plate 620 and separated by the barrier 643. The protruded shape of the barrier 643 significantly reduces the deposition of the sputtered atomic vapor sputtered from target 613 to target 610, and vice versa.

Referring to FIGS. 3 and 4, the targets comprising desired materials are mounted on the backing plates before sputtering. The workpiece is transferred into the process chamber 310 by a workpiece transfer system through a load lock. The process chamber 310 is sealed by gate valves. Air is evacuated from the process chamber 310 by a vacuum pumping system to reach an air pressure typically below $10^{-6}$ torr. The process chamber can then be refilled with desirable gas such as Argon, nitrogen, hydrogen, oxygen, or other gases to a pressure typically ranging 0.01 to 1000 milli-Torr.

During sputtering, the magnet 360 periodically scans the areas of a target 350 or 351 and creates a magnetic field that confines a plasma gas near the surface of the target 350 or 351. The cooling system keeps the target from over heating during the sputtering process. The workpiece 330 can be electrically grounded, biased or electrically floating. A RF field can also be used to drive the sputtered atomic vapor toward the top surface of the workpiece 330. The workpiece 330 is rotated by the workpiece rotation mechanism during sputtering to expose different angular areas to the deposition materials and to keep the deposited layer uniform.

Target 350 and 351 (or 510-513 and 610-613) can comprise different sputtering materials such a plurality of alternating thin layers of different deposition materials can be deposited on the substrate of the workpiece 330. Targets 350 and 351 can also comprise the same material for depositing layers of the same materials over the workpiece 330.

In accordance with the present invention, the deposition system 300 only requires a single magnetron source. A single magnet 360 is shared between different targets 350, 351. One target can therefore be sputtered at one time during the sputtering process. In contrast, the prior art systems (e.g. deposition system 200) that comprise plurality of targets include multiple magnetrons one for each target.

Figure 8:
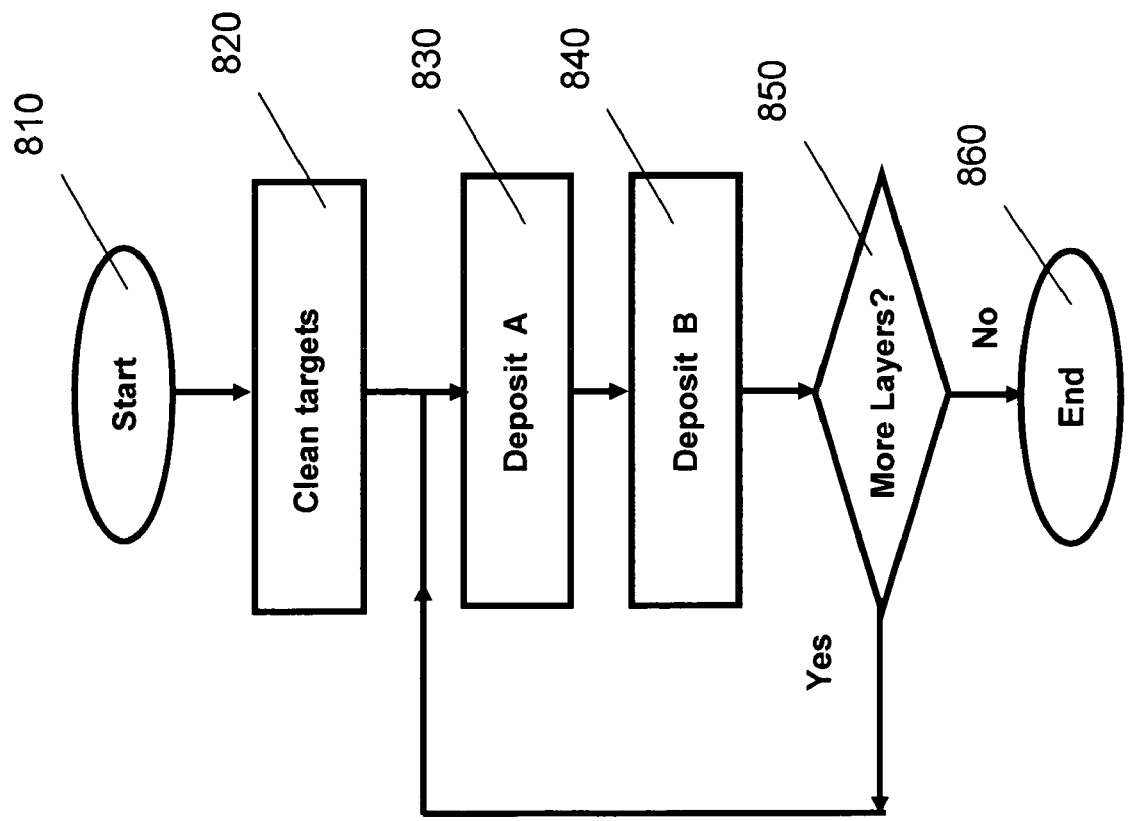
FIG. 8 is the flowchart for depositing a multi-layer structure on a workpiece in accordance with an embodiment of the present invention.

FIG. 8 shows a flowchart for depositing two Target Materials A and B on the workpiece 330 in the deposition system 300. The targets 350, 351 respectively comprise Target Materials A and B. If the targets 350, 351 are previously used in other deposition processes or exposed to the ambient environment, they can be cleaned first before the sputtering and deposition without a workpiece over the workpiece holder or a dummy workpiece. The workpiece 330 is then loaded into the process chamber 310 over the workpiece holder 320. A vacuum is established after pump down. A desirable gas is filled into the process chamber 310. The magnet 360 is moved to behind target 350. Target Material A is sputtered and deposit in step 830 over the workpiece 330 at a controlled rate while the magnet 360 scans the target 350 back and forth and the workpiece 330 rotates around the central axis. A first deposition layer comprising Material A is formed over the substrate of the workpiece 330.

Next, without breaking the vacuum, the magnet 360 is moved to behind target 351. In step 840, target Material B is sputtered and deposited over the first deposition layer comprising Material A over the workpiece 330 while the magnet 360 scans the target 351 and the workpiece 330 rotates. A second uniform deposition layer containing material B is formed over the first deposition layer. The capability of separating target and reducing cross contamination between targets is an important feature in the single-chamber deposition system 300. The prevention or reduction of contamination across targets 350, 351 allows the successive layers of two different Target Materials A and B to be deposited without the needs for target cleaning, target switching and associated vacuum pumping and stabilization cycles.

Another aspect of the invention is the realization that a minute amount of contamination in target 351 by Target Material A will usually not affect the properties of the stacked A/B layers. A minute amount of Target Material A may contaminate target 351 during the sputtering of Target material A off target 350 even in the presence of the gaps 540-543 and barriers 640-643. After the formation of the first deposition layer over the workpiece 330, the top surface of the target 351 may contain a minute amount of Target Material A over the substrate of Target Material B. It is realized through analyses and testing, however, that this will not affect the physical properties or stoichiometry of the A/B stacked layers because there is always a presence of Target Material A at the interface of the A/B deposition layers. As the second deposition layer comprising Target Material B grows in thickness, the minute contamination of Target Material A over target 351 is cleaned off of target 351. The purity of Target Material B can be controlled within tolerance. Another alternative is to clean the Target Material B in the absence of substrate before deposition of material B.

If alternative layers of Material A and Material B are to be deposited over the second deposition layer in step 850, the step 830 and step 840 are repeated until all pre-specified number and sequence of layers are deposited. While FIG. 8 shows the process of depositing a stacked layer structures A/B, A/B/A/B, A/B/A/B/A/B, etc., many other combinations of layered structures can be effectively accomplished by the deposition system 300 without breaking the vacuum and the vacuum down and up cycles. Examples of stacked layer structures comprising Target Materials A and B include A/B/A, A/A/B, A/B/B, A/A/B, A/B/A/B/A, etc.

Figure 9:
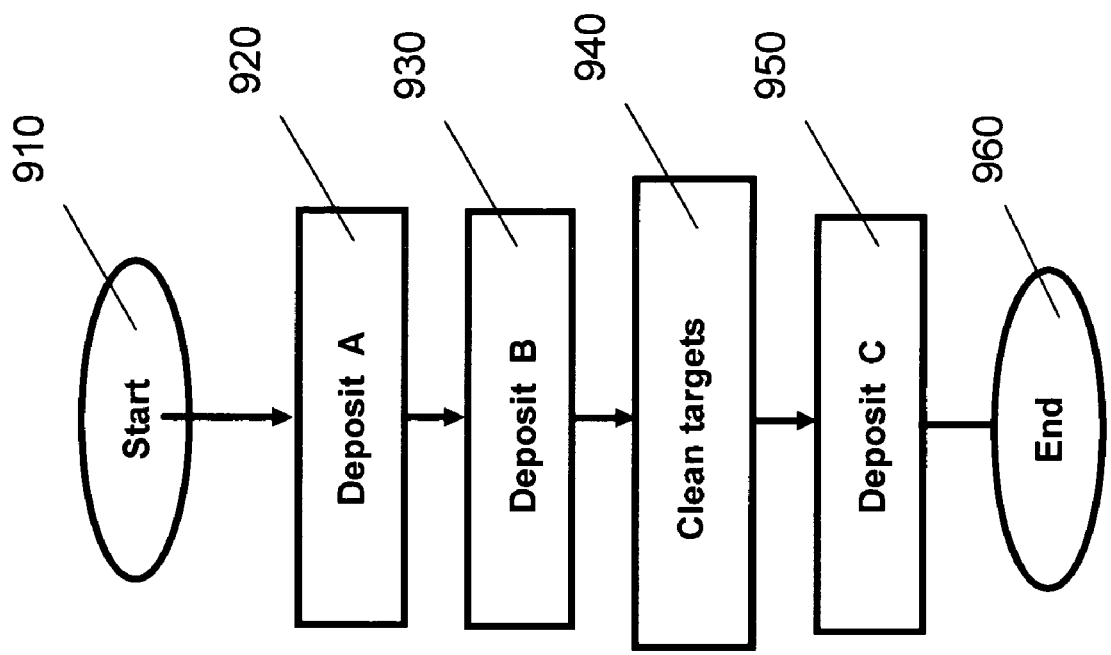
FIG. 9 is the flowchart for depositing a multi-layer structure on a workpiece in accordance with another embodiment of the present invention.

FIG. 9 illustrates the flowchart for forming a stacked layer structure A/B/C comprising three different Target Materials A, B and C. The first and second deposition layers respectively comprising Target materials A and B are formed in steps 920 and 930 similar to above described in relation to FIG. 8. Before the third deposition layer containing a different Target Material C is deposited, the targets can be cleaned in step 940 to prevent minute contamination of mostly the Target Material A over the target containing Target Material C. The cleaning process may include transferring the workpiece from the process chamber 310 to temporarily store in the load lock and sputtering the target comprising Target Material C and possibly other targets. The workpiece 330 is then transferred back over the workpiece holder 320. Target Material C is then sputtered to deposit the third deposition layer over the second deposition layer.

The reduction of the cleaning steps between the depositions of the first and the second deposition layers represents significantly reduced process time and improved throughput. In general, the disclosed system and deposition process do not require target cleaning if the composition of the next deposition layer is the same as that of one of the last deposited layers.

The disclosed deposition system 300 offers a combination of advantageous features in a single system. First, the disclosed deposition system includes only single process chamber. Its small footprint is ideal for experimental, research, and pilot development applications. Secondly, the disclosed deposition system is capable of multi-layer depositions without breaking the vacuum, therefore is of significantly increased processing throughput compared to the prior art system. Thirdly, the disclosed deposition system is simple and therefore easy to manufacture at lower cost compared to commercial available multi-chamber systems capable of multi-layer processing. The lowered manufacture cost allows affordability to users in purchasing a development deposition system or a plurality of deposition systems for multiple experiments in parallel. Finally, the disclosed deposition system and process are capable of delivering high-quality deposition layered structures with uniformity across the workpiece and material purity through stacked layers. The combination of the capabilities overcomes a number of the weaknesses in the prior art deposition systems.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A deposition system, comprising:
   a process chamber;
   a workpiece holder within the process chamber, configured to hold a workpiece;
   a first target comprising a first material, disposed within the process chamber;
   a second target comprising a second material, disposed within the process chamber;
   a third target comprising a third material, disposed within the process chamber, wherein the first target, the second target, and the third target respectively occupy different circular sectors of a circle, wherein the first target occupies a circular sector with an angular span equal to or smaller than 120 degrees;
   a single magnet assembly configured to scan in the vicinity of the first target and the second target and third target along a scanning direction, wherein the single magnet assembly has substantially a pie shape having an angular span smaller than 120 degrees, wherein the single magnet assembly is configured to scan across the first target to produce magnet flux substantially only over the first target to deposit the first material on the workpiece; and
   a transport mechanism operatively coupled to the magnet assembly, configured to move the magnet assembly from the first target to the second target in a rotational movement.

2. The deposition system of claim 1, wherein at least one dimension of the single magnet assembly is smaller than a dimension of the first target along the scanning direction.

3. The deposition system of claim 1, wherein the single magnet assembly does not produce substantial magnet flux over the second or third target when the single magnet assembly scans across the first target.

4. The deposition system of claim 1, wherein a rotational speed of the rotational movement of the magnetic assembly is selected to be incommensurate to an angular velocity of the workpiece holder.

5. The deposition system of claim 1, wherein the first material is different from the second material and the third material.

6. The deposition system of claim 1, wherein the first target and the second target are electrically isolated from the process chamber.

7. The deposition system of claim 1, wherein a phase of the rotational movement of the magnetic assembly is adjusted relative a phase of an angular velocity of the workpiece holder.

8. The deposition system of claim 1, further comprising a rotational drive mechanism operatively coupled to the workpiece holder and configured to rotate the workpiece holder.

9. The deposition system of claim 1, further comprising a fourth target comprising a fourth material, disposed within the process chamber, wherein the fourth target occupies a circular sector of the circle, wherein the first target occupies a circular sector with an angular span equal to or smaller than 90 degrees, wherein the single magnet assembly has an angular span smaller than 90 degrees.

10. The deposition system of claim 1, wherein the first target, the second target, and the third target are electrically isolated from each other.

11. The deposition system of claim 1, wherein the first target, the second target, and the third target are electrically connected with each other.

12. The deposition system of claim 1, wherein the first target, the second target, and the third target are separated from each other by a gap or a barrier.

13. The deposition system of claim 1, further comprising a blocking plate configured to be moved to a position to expose the first target while covering the second target and the third target.

14. A deposition system, comprising:
   a process chamber;
   a workpiece holder within the process chamber, configured to hold a workpiece;
   a rotational drive mechanism operatively coupled to the workpiece holder and configured to rotate the workpiece holder;
   a plurality of three or more targets disposed in a circle within the process chamber, wherein each of the targets occupies a different circular sector in the circle, wherein each circular sector in the circle is occupied by one of the plurality of targets, wherein one of the targets occupies a circular sector with an angular span equal to or smaller than 120 degrees;
   a single magnet assembly configured to be disposed in the vicinity of the plurality of targets, wherein the single magnet assembly has substantially a pie shape having an angular span smaller than 120 degrees; and
   a transport mechanism operatively coupled to the magnet assembly and configured to move the magnet assembly across the plurality of targets in a rotational movement, wherein the transport mechanism is configured to scan the single magnet assembly across the plurality of targets to respectively deposit materials from the plurality of targets onto the workpiece, wherein the single magnet assembly is configured to scan across one of the plurality of targets to produce magnet flux substantially only over said one of the plurality of targets.

15. The deposition system of claim 14, wherein the one of the targets occupies a circular sector with an angular span equal to or smaller than 90 degrees, wherein the single magnet assembly has substantially a pie shape having an angular span smaller than 90 degrees.

16. The deposition system of claim 14, wherein a rotational speed of the rotational movement of the magnetic assembly is selected to be commensurate to an angular velocity of the workpiece holder.

17. The deposition system of claim 14, wherein a rotational speed of the rotational movement of the magnetic assembly is selected to be incommensurate to an angular velocity of the workpiece holder.

18. The deposition system of claim 14, wherein the plurality of three or more targets are separated from each other by a gap or a barrier.

19. The deposition system of claim 14, further comprising a blocking plate configured to be moved to a position to expose one of the plurality of three or more targets while covering at least another one of the plurality of targets.

20. A deposition system, comprising:
   a process chamber;
   a workpiece holder within the process chamber, configured to hold a workpiece;
   a rotational drive mechanism operatively coupled to the workpiece holder and configured to rotate the workpiece holder;
   a plurality of four or more targets disposed in a circle within the process chamber, wherein each of the plurality of four or more targets occupies a circular sector in circle, wherein one of the targets occupies a circular sector with an angular span equal to or smaller than 90 degrees;

a single magnet assembly configured to be disposed in the vicinity of the plurality of targets, wherein at least one dimension of the single magnet assembly is smaller than a dimension of the one of targets along the scanning direction; and a transport mechanism operatively coupled to the magnet assembly, configured to move the magnet assembly across the plurality of four or more targets in a rotational movement, wherein the transport mechanism is configured to scan the single magnet assembly across the plurality of four or more targets to respectively deposit materials from the plurality of targets onto the workpiece, wherein the workpiece is not subject to a translation movement while the materials are deposited from the plurality of targets onto the workpiece, wherein the transport mechanism is configured to scan the single magnet assembly back and forth across one of the plurality of targets to produce magnet flux substantially over only said one of the plurality of four or more targets.

* * * * *